United States Patent

Ivers et al.

[11] Patent Number: 5,999,163
[45] Date of Patent: Dec. 7, 1999

[54] DIGITAL OSCILLOSCOPE WITH HIGH LIVE TIME RECORDING OF SIGNAL ANOMALIES AND METHOD

[75] Inventors: Kevin T. Ivers, Woodland, Wash.; Eric P. Etheridge, Beaverton; Roy I. Siegel, Portland, both of Oreg.

[73] Assignee: Tektronix, Inc., Wilsonville, Oreg.

[21] Appl. No.: 08/742,544

[22] Filed: Nov. 1, 1996

[51] Int. Cl.⁶ .................................................. G09G 5/36
[52] U.S. Cl. ................................... 345/134; 324/121 R
[58] Field of Search ...................... 364/487; 324/121 R; 345/134, 133, 135

[56] References Cited

U.S. PATENT DOCUMENTS

| | | | |
|---|---|---|---|
| 4,743,844 | 5/1988 | Odenheimer et al. | 324/121 R |
| 4,829,293 | 5/1989 | Schalter | 340/722 |
| 5,028,914 | 7/1991 | Povenmire | 340/720 |
| 5,123,034 | 6/1992 | Grujon | 377/19 |
| 5,247,287 | 9/1993 | Jonker et al. | 345/134 |
| 5,250,935 | 10/1993 | Jonker et al. | 345/134 |
| 5,530,454 | 6/1996 | Etheridge et al. | 345/134 |

*Primary Examiner*—Matthew Luu
*Assistant Examiner*—Vanel Frenel
*Attorney, Agent, or Firm*—Bennet K. Langlotz; Boulden G. Griffith; Thomas F. Lenihan

[57] ABSTRACT

A method of analyzing and displaying waveforms by acquiring an electrical signal, converting it into a stream of digital data points, and sequentially storing each data point to a memory device. Then, analyzing each of the data points to detect whether the data point is an anomalous data point outside of a preselected range. Until an anomalous data point is detected, the steps of acquiring, converting, storing, and analyzing data are repeated. Shortly after the anomalous data point is detected, storage of the data points to the memory device is stopped, so that the anomalous data point and adjacent data points are preserved in memory. Then, the anomalous data point is displayed, preferably along with the immediately preceding and succeeding data points.

20 Claims, 3 Drawing Sheets

DIGITAL OSCILLOSCOPE WITH HIGH LIVE TIME RECORDING OF SIGNAL ANOMALIES AND METHOD

FIELD OF THE INVENTION

This invention relates to the analysis and display of electrical signals by oscilloscopes, and more particularly to analysis of brief anomalies in very high frequency signals.

BACKGROUND AND SUMMARY OF THE INVENTION

Conventional digital storage oscilloscopes (DSOs) record and display a digital representation of an electrical signal for analysis. This signal is converted to a stream of digital data points. When operating at the highest resolution of time intervals, such as 1 billion data points per second, conventional DSOs are unable to display all the received data on a finite sized screen, typically about 500 pixels wide, with the screen refreshed at finite time intervals, typically 60 times per second. Under these circumstances, the DSO is only capable of displaying 30,000 data points per second (500 pixels×60 refreshes/second,) or 0.003% of the available signal. This is referred to as a 0.003% "live time" characteristic.

To provide a useful display, typical DSOs selectively display only a small fraction of the data. For example, to analyze the characteristics of a repeated transition from a high to a low logic state, with the highest time base resolution, the DSO may convert, rasterize and display only the small amount of data received around the time of the critical transition, without processing or displaying the signal during the much larger time intervals in between the critical repeated events. To provide enhanced viewability, such DSOs may provide a persistent display that allows a user to note a single transient anomaly occurring during one of the brief critical intervals. Unfortunately, if such an anomaly occurs during the other 99.997% of the time, it will go unobserved and unrecorded. To display a greater time interval per screen refresh, resolution may be vastly reduced, but this prevents the visualization of brief anomalies. While useful for analyzing transients or anomalies occurring at known times, these systems are unsuited for detecting and displaying unpredictably occurring anomalies.

To provide improved live time performance, DSOs have been developed that rasterize acquired data into a composite bit map, then display a sequence of composite bit maps at the display rate. Such a system is disclosed in U.S. Pat. No. 5,530,454 to Etheridge et al., which is incorporated herein by reference. Each bit map will include a multitude of overlaid data traces, so that an anomaly departing from the normally repeated and overlaid signal data will be visible. This is analogous to a photographic time exposure of a busy road taken at night; the light traces of properly driven individual cars will be indistinguishable from each other, but a car veering off the road will be recorded, although without a visible record of the car's path before it veered from the normal flow. Similarly, the signal trace immediately before and after an anomaly will be lost in the multitude of other nominal traces preventing a more detailed analysis of the anomalous signal. In addition, while such systems enjoy vastly improved live times, up to about 20%, these are still inadequate to detect infrequent and unpredictable anomalies. Essentially, this approach is not limited by the display update rate as in typical DSOs, but instead by the rate at which the acquired data can be rasterized and transferred for display.

Other conventional oscilloscopes have employed limit tests to compare a newly-received waveform to a previously-received reference waveform. U.S. Pat. No. 4,510,571 to Dagostino et al. discloses a system in which a reference digital signal segment is stored, then a subsequent signal segment that is expected to be identical to the reference signal is received and compared. If the new signal segment deviates from expectations, it is stored for analysis or display. New signal segments are acquired and compared at intervals. Such a system has several disadvantages.

First, the signal segment that may be analyzed is brief relative to the time period before the next signal is acquired; live time is very low. The reference and newly acquired waveforms are limited to the duration of the display interval; memory capacity beyond this would not be useful and would increase costs needlessly. Also, the comparison of the new waveform to the reference waveform is conducted after the waveform is received. The new waveform is stored, then the compared with the respective waveforms also stored in memory. Even without the limitations on memory size, this serial "store-retrieve-compare" approach has substantial down time while memory is being read, during which no acquired signal may be written. While such a system is adequate for analysis of brief, repeated signal segments, it is inadequate for identifying signal anomalies that may occur at any time.

Second, the Dagostino system does necessarily not provide for analysis of signal characteristics preceding or following a "glitch." While the stored signal segment containing the glitch is preserved, a glitch occurring near the beginning or end of the stored period may not have adequate data preceding or following to provide a complete analysis.

Third, the Dagostino system is useful only for determining whether a signal complies with a single reference signal. Only one value or range will be tolerated for each interval. This prevents such a system from being applicable to logic signals that may have two or more acceptable values at any time period, such as a conventional "eye diagram." In logic applications, it is limited to determining only that the logic value is as expected, and will not confirm that a logic system is generally performing as expected, regardless of logic value at particular time.

Thus, there is a need for a system and method that permits the recording and high resolution analysis of an unpredictably timed, brief anomalous signal, without obscuring the nominal data adjacent the anomaly. Such is provided by a method of analyzing and displaying waveforms by acquiring an electrical signal, converting it into a stream of digital data points, and sequentially storing each data point to a memory device. Then, analyzing each of the data points to detect whether the data point is an anomalous data point outside of a preselected range. Until an anomalous data point is detected, the steps of acquiring, converting, storing, and analyzing data are repeated. Shortly after the anomalous data point is detected, storage of the data points to the memory device is stopped, so that the anomalous data point and adjacent data points are preserved in memory. Then, the anomalous data point is displayed, preferably along with the immediately preceding and succeeding data points.

DETAILED DESCRIPTION OF A PREFERRED EMBODIMENT

Figure 1:
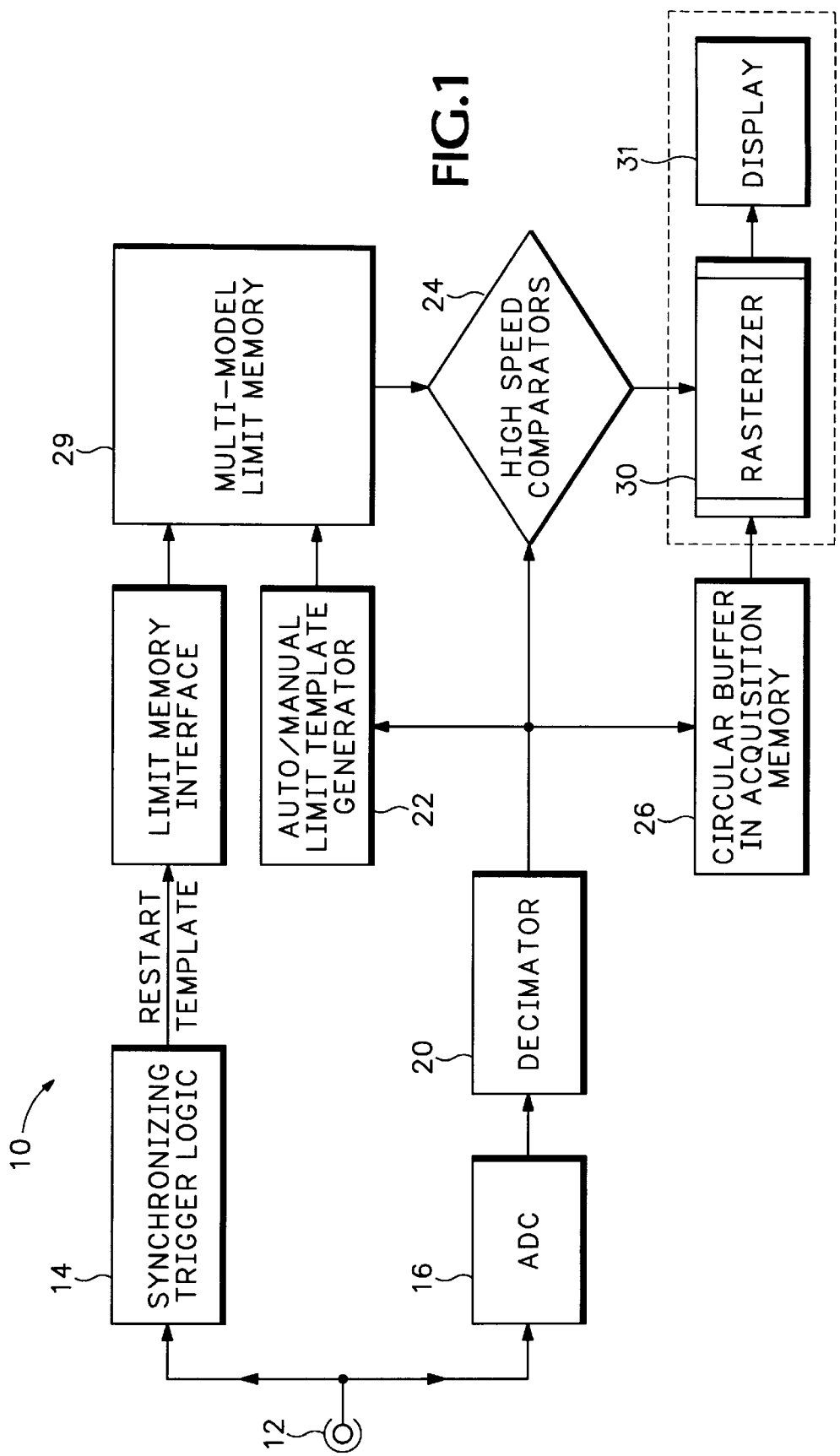
FIG. 1 is a block diagram of a digital oscilloscope according to a preferred embodiment of the invention.

FIG. 1 shows a digital oscilloscope 10 in simplified form. As in previous systems, an input connection 12 connected to a signal source (not shown) is connected to a synchronizing trigger system 14 and an analog-to-digital (ADC) converter 16. The ADC 16 converts a continuously varying analog electrical signal received from the signal source into a sequential series of digital values or data points, each corresponding to the voltage of the input signal at a particular time. Preferably, these times are separated by equal intervals.

The ADC is connected to additional data acquisition circuitry, including a decimator 20, which operates to receive the digital data from the ADC, and as necessary, eliminate some digital data at equal intervals to reduce the data rate when the highest speed data acquisition is not required. For instance, in a DSO with a 1 Giga-sample per second (GS/s) capability, only one data point out of each bundle of 100 need be analyzed for slowly varying signals.

The decimator is connected to three components: a limit template generator 22, which establishes compliance reference standards for determining whether a later signal is out of compliance, a comparator 24 for comparing a later signal to the reference standards, and an acquisition memory circular buffer 26, which stores the data points as they are generated and decimated for subsequent display, as needed. A controller (not shown) is connected to and controls all components of the oscilloscope 10. The common connection of the buffer and the comparator permits their simultaneous use of the incoming data stream, so that neither has to await the completion of the other's operation before using a data point.

The limit template generator 22 establishes a standard for nominal characteristics of the signal, with compliant and non-compliant voltage values being generated for each discrete time interval following a triggering event. The template may be manually generated and input into the system via an input device (not shown) such as a disc drive. Manual template generation is appropriate when a predefined industry standard of performance must be met. Alternatively, a template may be automatically generated from recently acquired data when absolute performance values are not critical, but when a signal requires analysis to determine whether any data points have departed from existing patterns of performance. For automatic template generation, a selected time interval corresponding to multiple repeated samples of a wave form may be sampled to establish maximum and minimum acceptable voltage values for each time interval recorded.

A multi-modal limit memory 29 is connected to the output of the template generator 22, and stores the template entered or generated in the generator. As will be discussed below, the limit memory stores a limit set of one or more compliant voltage limit ranges for each time interval following a triggering event that provides a common reference point for repeated patterns in the signal. The triggering event is typically a clock pulse in a system analyzing a logic signal. The limit memory must have the capacity to store several limit ranges for each of the 500 or more time intervals that may occur between clock pulses at the highest sampling rate (1 GS/s in the preferred embodiment.)

The high speed comparator 24 is connected to the output of the limit memory 29 and to the data sample stream output by the decimator 20. For each data sample, the comparator determines whether it falls within a limit range of the limit set for the appropriate time interval following the triggering event. If a sample does not fall within the limit ranges of the appropriate limit set, the comparator sends a signal to the controller, which then acts to preserve and display the data samples collected before, during, and after the first noncompliant data point. Because the comparator is using unprocessed, unstored, unrasterized incoming data, it may operate rapidly at the highest data rate without needing to await the actions or results of any other component receiving the data.

Preferably, the comparator has the capacity to accumulate numerous samples and limit sets, so that they may be analyzed rapidly and simultaneously, even though the speed of the memory chips may be much less than the sampling rate. For instance, the memory chips, to be cost effective under current conditions, may be limited to a 12 ns speed grade, while samples are collected every 1 ns. When the limit memory provides 16 limit sets at a time to the comparator, it need do so only every 16 ns to keep up with the highest data sampling rate of 1 S/ns (1 GS/s.) Thus, the comparator may be operating at a time lag following input of data points, and making a comparison after all 16 samples are received. While the samples are being analyzed, an input buffer in the comparator may store incoming samples for the next batch analysis. The buffer should be sized to store data corresponding to a time interval substantially longer than the time lag of the comparator, so that data immediately preceding the anomalous data point is not overwritten in the interval between acquisition of an anomalous data point and the recognition of the anomaly.

A rasterizer 30 is connected to the output of the circular buffer 26, and receives the data stream stored in the buffer. The rasterizer converts the data samples into a bitmap matrix showing a function of voltage with respect to time. The rasterizer may generate a conventional bitmap, or may vectorize the data to interpolate between data points for a more easily interpreted display. A display 31 connected to the rasterizer receives the rasterized output and displays it in a conventional manner. If desired, the display may be updated periodically, even in the absence of a limit failure, such as once out of each x display update intervals. Because this requires the memory and time intensive rasterization process, it causes momentary "dead time" during which an anomalous event will not be detected or recorded. A user may weigh the trade off between true 100% live time and the need to observe an updated display.

Figure 2:
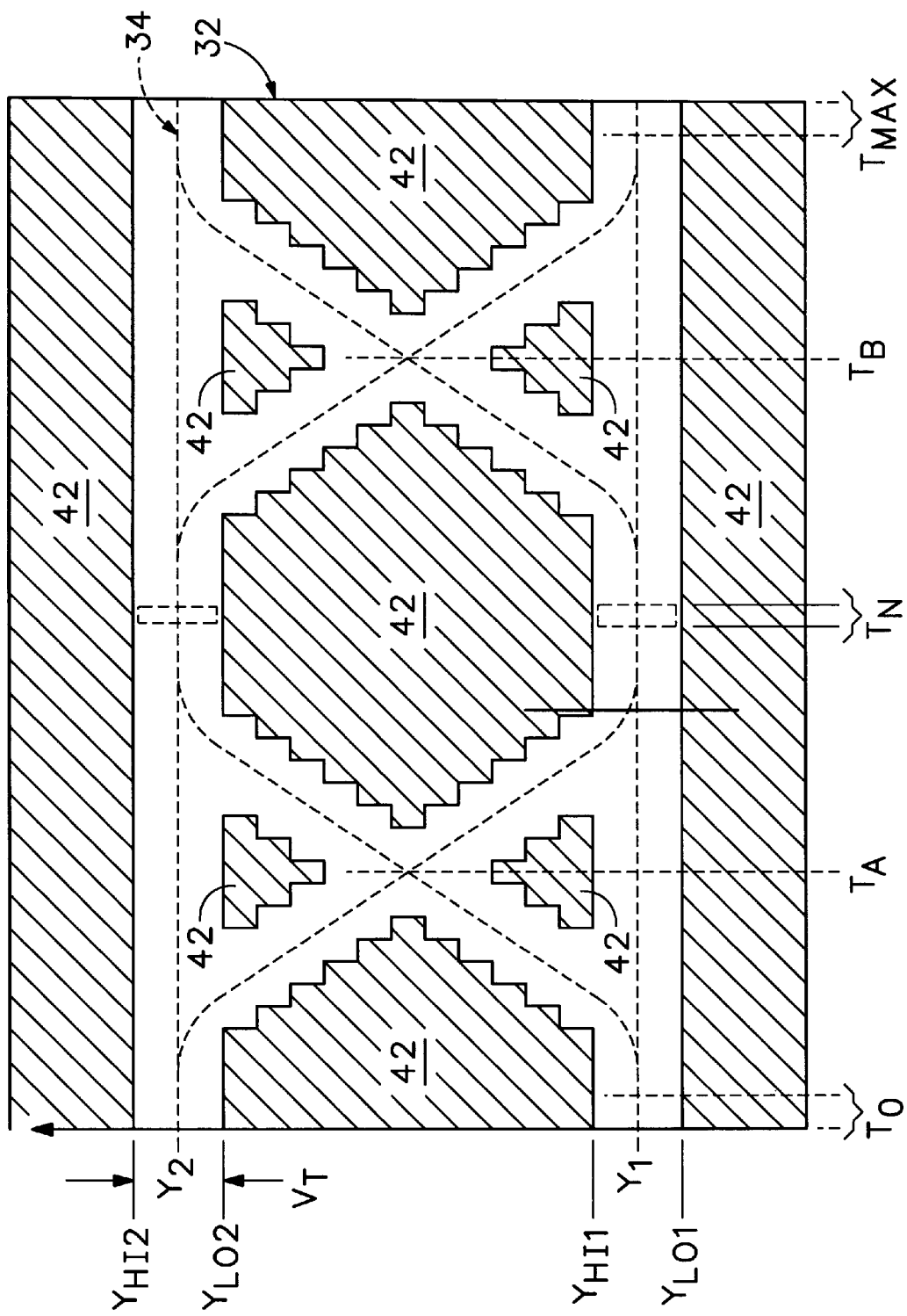
FIG. 2 is schematic view of signal display and memory matrix according to the embodiment of FIG. 1.

As shown in FIG. 2, a chart 32 illustrates the relation between the template and the input signal. An "eye diagram" 34 is shown in dashed lines. The horizontal axis represents time, and the vertical axis represents voltage. The initial time T0 represents the first data point after a triggering event. The time scale is divided into discrete divisions, each reflecting a data point taken at the decimated sampling rate. The eye diagram reflects the possible paths of a logic signal before, between, and following two possible transition time points TA, TB. For each transition point, the signal may have started either at a high voltage Y2, or a low voltage Y1, and remain at the same voltage, or change along a steep slope to the other voltage. Thus, a logic signal that is controlled by clock pulses corresponding to the transition points will nominally follow the dashed lines of the eye diagram.

The shaded, stepped regions in chart 32 represent non-compliance zones 42. If a signal falls into any of these zones, it will be considered noncompliant or anomalous. For each time interval Tn following the triggering event at T0, at least one voltage limit range encompassing the nominal voltage level is stored in the limit memory 30. In the illustrated example, each interval has 2, 3, or 4 such limit ranges, with the group of limit ranges for a given interval being the "limit set" for that interval. Because a signal may acceptably depart from the nominal voltage by a tolerated amount, a tolerance band having a width VT defines the boundaries of the compliance limits 42. Thus, for Tn, the limit set is [(Y1 ½ VT, Y1+½ VT), (Y2-½ VT, Y2+½ VT), or (Ylo1, Yhi1, Ylo2, Yhi2). In the illustrated example, there are 4, 6, or 8 limits per limit set. The storage and transfer of these few limits for compliance checking is less memory intensive than storing and transferring entire columns of a bit mapped matrix for comparisons, as has been done in systems that make a limit analysis after data is rasterized. It is significantly faster simply to compare acquired values in real time against a few limit ranges, than it is to rasterize all incoming data into a bit map. Generating raster bit maps in acquisition memory at a high sample rate requires memory with an unusually high bandwidth and/or high speed, making such an approach cost ineffective.

As part of the generation of the limit template, a time tolerance may also be provided whereby the tolerance band around the nominal signal path may be expanded to reflect tolerable voltage levels of adjacent time intervals, or of time intervals within a given time difference from each interval. This accommodates any tolerable time shift in the signal where there is a steep transition.

Operation of the Preferred Embodiment
Definitions

Limit Range—a vertical region defined for a particular point in time from a triggering event. It consists of two values Ylo and Yhi, which represent the top and bottom portion of the compliance range. These values define a tolerance band to avoid mistaking small voltage variations as anomalies.

Limit Set—a group of limit ranges applicable to a particular time interval following a trigger. Each limit set contains up to 'NumbLimits' of Limit Ranges.
Limit Parameters NumbLimits—Number of limit ranges to use in a limit set. In the illustrated example, there are 2, 3, or 4 such ranges.

LmtXTol —Time tolerances for each limit in a set.

LmtYTol (or VT)—Amplitude or voltage tolerances for each limit in a set.

TltLmtSets (or Tmax)—Number of limit sets to compare per trigger. Effectively, this is the maximum number of acquisition points or samples that will be compared on each trigger. If the trigger occurs before reaching this number, then less than this number will actually be compared per trigger.

DsyUpd—Update display. Options
only on limit failure.
every X seconds regardless.
FailSave—Save acquisition on limit failure? Options:
YES.
NO.
Stop/Cont—Stop on limit failure? Options:
STOP.
CONTINUE.
AutoGen—Auto generate limits. Options:
PREDEFINED, load predefined template.
SNAPSHOT, once at the beginning or on demand.
CONTINUOUS, once every X seconds.
NumbColl—Number of acquisitions to combine when auto generating limits. In multi-modal repetitive signals, multiple acquisitions must be acquired before all possible legal signal deviations are captured.

RespondTo—Defines limit failure event to respond to. Useful when failures occur frequently, and analysis of a later failure is desired
ALL LIMIT FAILURE.
Nth LIMIT FAILURE.

Figure 3:
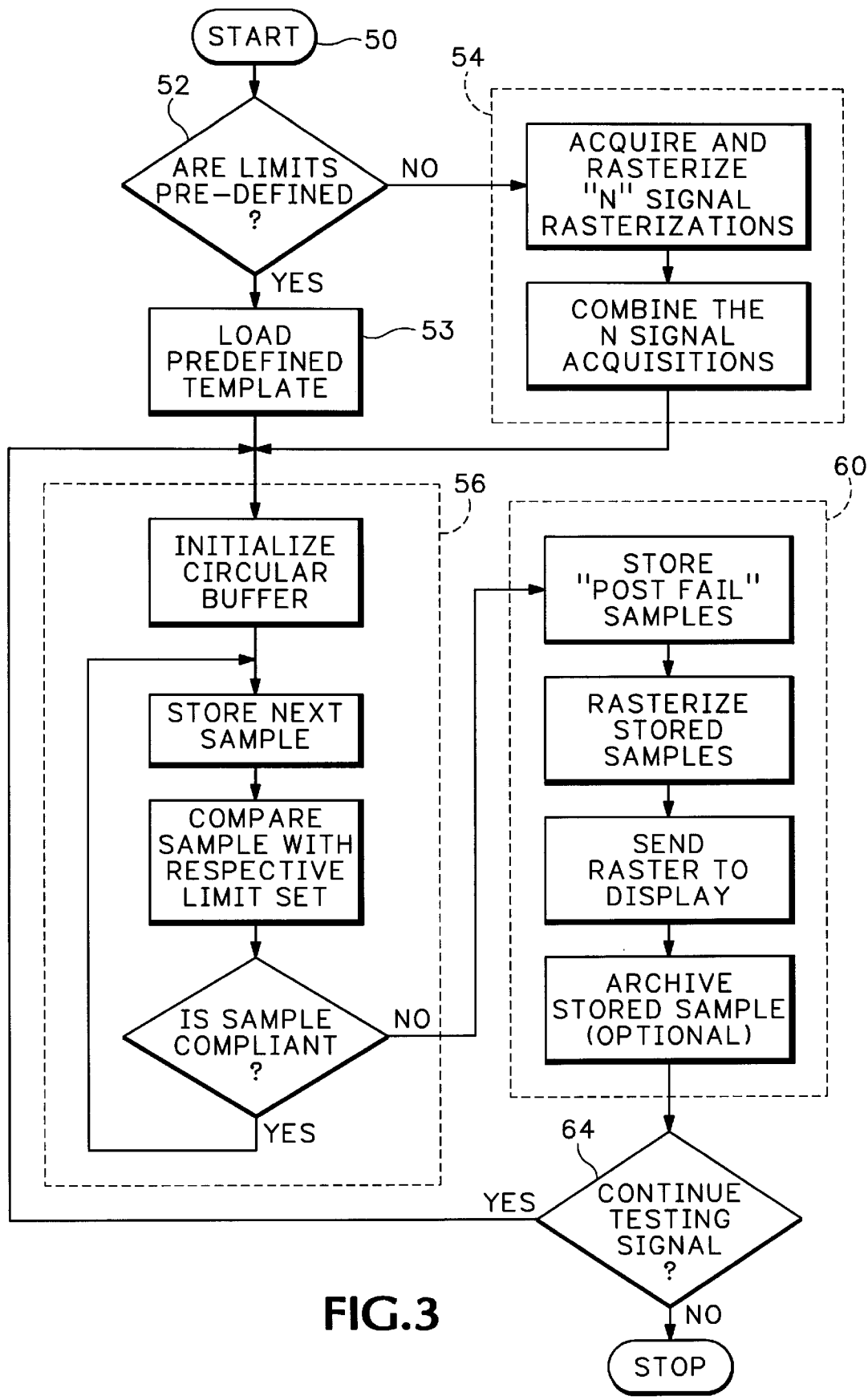
FIG. 3 is an operation flow chart for the embodiment of FIG. 1.

As shown in the FIG. 3 flow chart, the following steps represent the normal operation of the system of the preferred embodiment:
Start. 50
Determine limit template procedure. 52
Are Limits/Template Predefined?
If "no," go to "Establish Limits/Template."
If "yes," load user defined template 53 and parameters, and setup oscilloscope to appropriate settings in order to acquire the repetitive signal in the manner required by the limit template. (trigger, timebase, channel, etc.)
Establish Limits/Template. 54
Automatically generate limits mode.
Setup oscilloscope to desired settings (trigger, timebase, channel, etc.)
Define limit test parameters.
Acquire TltLmtSets data points for each trigger. Repeat NumbColl times. Generate the limit template as follows:

Combine the separate acquisitions together by first vectorizing them and then overlaying their respective vectorized points. Overlapping points from different acquisitions combine into one. The result of this combining process is the Combined Acquisition Raster.

Derive up to 'NumbLimits', limit values for each column (point in time) of the combined acquisitions. This is done by applying the tolerances expected for each limit (X and Y) to each point in the Combined Acquisition Raster. This will define limit regions in each column.

Next, starting at the bottom of the column, scan the column upwards, row by row, until the first limit region is encountered. Define Ylo of the first Limit Range with this row number. Next, scan upwards from this point until the end this first limit region is encountered. Define Yhi as this row number.

Repeat the scanning process, upwards, row by row until reaching the top row of the column. If more Limits Ranges are found than 'NumbLimits', report as error. All unused Limit ranges are set to a NULL value, and hence will not affect Limit Testing.

Once 'TltLmtSets' have been generated, the Limit template has been generated. Load this template into template memory.

A limit template may be optionally redefined periodically to accommodate slowly drifting signals and the like, or simply may be acquired as a snapshot at the start of operation
Start Acquisition Limit Test. 56
Initialize circular buffer. Set CBufPtr to 0.
Wait for Synchronizing Trigger. This defines the start of the repetitive signal.
Store the next sample data point:
  FOR (LmtSetPtr=0; LmtSetPtr<TltLmtSets; LmtSetPtr++)
  {,
  Wait for sample to be available.
  Store next sample to circular buffer in acquisition memory at CBuEPtr and increment CBufPtr.
  If CBufPtr>CBufMax, then set CBuEPtr=0. This wraps the pointer if beyond buffer to overwrite the oldest stored samples at the top of the buffer.

Compare next sample with the limits sets contained in LmtSets[LmtSetPtr].

If the sample is not contained by any Limit Range in the referenced Limit

Set, then set OutLmtFlag and break out of FOR Loop.
},

If OutLmtFlg then go to "Store Failure Data."

Else, Continue updating the circular buffer with samples (return to "Store sample to circular buffer") until a Synchronizing Trigger occurs.

Process Failure Data. 60

Store "PostFail" samples into the circular buffer by continuing sample storage for a limited period, so that a range of "PreFail" and "PostFail" samples are stored in the circular buffer.

Send the contents of the circular buffer to the Rasterizer for display.

If "FailSave", store the failed samples to a separate storage memory archive.

If "Stop/Cont" 64 is CONT, then return to "Start Acquisition Limit Test."

Else stop operation and await a "Start Acquisition Limit Test" signal.

While the disclosure is made in terms of a preferred embodiment, the invention is not intended to be so limited.

We claim:

1. A method of analyzing and displaying waveforms comprising the steps of:

acquiring an electrical signal;

while acquiring the signal, converting the signal into a stream of digital data points;

sequentially storing each data point to a memory device;

while sequentially storing each data point, simultaneously analyzing the data point to detect whether it is an anomalous data point by comparing each data point to a preselected range of values to determine if said data point lies outside of said preselected range;

until the anomalous data point is detected, simultaneously and continuously storing and analyzing each subsequent data point;

after the anomalous data point is detected, stopping the storing of the data points to the memory device such that the anomalous data point and a plurality of sequentially adjacent data points are not overwritten; and displaying a waveform representing a first occurrence of anomalous data point and said adjacent data points.

2. The method of claim 1 including analyzing every one of the data points preceding the anomalous data point, such that a brief anomaly in the signal will be detected and recorded irrespective of the time of occurrence.

3. The method of claim 1 wherein storing each data point occurs in an uninterrupted pattern of essentially evenly spaced intervals, such that the anomalous data point will be stored irrespective of the time of occurrence.

4. The method of claim 1 wherein the step of stopping storing occurs a preselected interval after the anomalous data point is detected, such that a sequence of data points following the anomalous data point are retained in the storage device.

5. The method of claim 1 wherein the step of analyzing each of the data points includes comparing the each of the data points with more than one separate preselected range.

6. The method of claim 1 wherein the step of storing includes overwriting previously stored data points if the memory device is full.

7. The method of claim 6 wherein the step of overwriting comprises overwriting the oldest data point stored in the device.

8. The method of claim 1 wherein the step of displaying comprises displaying a range of data points acquired immediately before and after the acquisition of the anomalous data point.

9. The method of claim 1 including stopping acquiring and converting following a preselected time interval after the anomalous data point is detected.

10. The method of claim 9 wherein the step of displaying comprises rasterizing a range of data points including the anomalous data point, and wherein step of rasterizing occurs only after stopping acquiring the signal.

11. The method of claim 1 including generating the preselected range by storing a sequence of data points.

12. The method of claim 11 wherein the preselected range is updated periodically while acquiring the signal.

13. A signal analysis instrument, comprising:

a signal input for receiving an electrical signal;

an A/D converter for converting the electrical signal to a series of data points expressed as binary digits;

a continuously operable circular storage buffer coupled to the A/D converter;

a limit memory device for storing a limit range;

a binary comparator continuously operable simultaneously with the storage buffer, and having a first input buffer coupled to the A/D converter and a second input coupled to the limit memory device, the comparator being operable to determine whether a signal received at the first input is within a limit range received from the limit memory device; and a rasterizer connected to the storage buffer and to the comparator, and operable to rasterize data contained in the storage buffer in response to a signal from the comparator that the signal is outside the limit range;

said rasterized data corresponding to a first occurrence of an anomaly.

14. The apparatus of claim 13 wherein the signal input includes an analog to digital converter.

15. The apparatus of claim 13 wherein the circular buffer includes storage means for continuously overwriting the oldest data contained in the storage buffer with the most recent received data.

16. The apparatus of claim 13 wherein the limit memory device contains at least a pair of limit range values for each of a plurality of time intervals.

17. The apparatus of claim 13 wherein the comparator is operable to receive a limit range from the limit memory, to receive a signal from the signal input, and to determine whether the signal is within the limit range.

18. The apparatus of claim 13 including a template generator connected to the signal input and to the limit memory device, and operable to provide a set of new limit ranges to the limit memory device based on a signal received from the signal input.

19. A digital oscilloscope, comprising:

a signal input for receiving an electrical signal;

an analog to digital converter connected to the signal input and operable to generate a sequence of digital samples corresponding to the signal applied to the signal;

storage means coupled to the analog to digital for continuously and uninterruptedly generating, updating, and maintaining a record of a plurality of most recently received ones of said digital samples;

a limit memory device for storing values corresponding to a limit range;

a binary comparator continuously and simultaneously operating with the storage buffer, and having a first input buffer coupled to the A/D converter and a second input coupled to the limit memory device, the comparator being operable to determine whether each of said digital samples of said signal received at the signal input is within said limit range received from the limit memory device; and a rasterizer connected to the storage buffer and to the comparator, and operable to rasterize data contained in the storage buffer in response to a signal from the comparator that the signal is outside the limit range;

said rasterized data corresponding to a first occurrence of an anomaly.

20. The digital oscilloscope of claim 19 further including a rasterizer connected to the storage means, and a display connected to the rasterizer, such that the record is converted to a displayable format and displayed for analysis.

* * * * *